United States Patent [19]

Brice et al.

[11] Patent Number: 4,529,027

[45] Date of Patent: Jul. 16, 1985

[54] METHOD OF PREPARING A PLURALITY OF CASTINGS HAVING A PREDETERMINED COMPOSITION

[75] Inventors: John C. Brice, Copthorne Bank; Colin R. Brough, Blackburn, both of England

[73] Assignee: U.S. Philips Corporation, New York, N.Y.

[21] Appl. No.: 500,591

[22] Filed: Jun. 2, 1983

[30] Foreign Application Priority Data

Jun. 14, 1982 [GB] United Kingdom ............... 8217220

[51] Int. Cl.³ .................... B22D 23/08; H01L 7/38
[52] U.S. Cl. .................... 164/76.1; 164/47; 164/122.2; 156/622; 156/616 R
[58] Field of Search .......... 164/47, 122, 122.1, 164/122.2, 76.1; 156/622, 616 R

[56] References Cited

U.S. PATENT DOCUMENTS 3,694,275 3/1969 Nelson ..................... 156/622 X
3,741,825 5/1973 Lockwood et al. ......... 156/622 X

*Primary Examiner*—Nicholas P. Godici
*Assistant Examiner*—Kenneth F. Berg

*Attorney, Agent, or Firm*—Paul R. Miller

[57] ABSTRACT

A method is set forth for simultaneously preparing a plurality of castings of a solution of an element, or compound, in a solvent, which solvent may also be an element and/or a compound. The solution is saturated at a temperature $T_s$. A problem in liquid epitaxy growth processes is the simple preparation of growth charges of sufficient reproducible composition and size to produce epitaxial layers of reproducible composition and thickness. The present invention provides a melt consisting of the solvent, of the solvent together with at least one constituent of the solution, or of a solution which is unsaturated at the temperature $T_s$, which melt is prepared in a boat body of a liquid-tight boat assembly. An equilibrium is established at $T_s$ between the melt and a solid body having an excess of any constituent in which the melt is deficient with respect to the saturated solution so as to form the saturated solution. The saturated solution is transferred into a plurality of moulds in which the solution is allowed to solidify to form the castings. The solid body is contained in a solid-retaining portion of a trough of the boat body, which portion is separated from the remainder of the trough by an apertured partition.

8 Claims, 4 Drawing Figures

METHOD OF PREPARING A PLURALITY OF CASTINGS HAVING A PREDETERMINED COMPOSITION

The invention relates to a method of preparing a plurality of castings having a predetermined composition, and particularly to a method of preparing castings which consist of charges of a solid solution which are to be used in liquid phase epitaxy growth processes.

BACKGROUND OF THE INVENTION

A problem in the growth of layers of ternary or quaternary compositions by liquid phase epitaxy processes is to produce layers of a reproducible composition and thickness. This problem is particularly significant in processes using a sliding boat method due to the small quantity of liquid used for growing a layer, which makes composition control difficult, and also when growing ternary materials having a general formula $X_xY_{1-x}Z$ in which the solid deposited from a liquid solution has a very different X:Y ratio from that prevailing in the liquid. Many of the III-V compounds show this effect, as does cadmium mercury telluride. In a sliding boat method, a substrate is contacted with a solution of the layer material, which solution must at some stage of the contact time be supersaturated in order to allow growth to occur. Since for most solvents used in liquid phase epitaxy, the solubility of the layer material in the solvent increases with increasing temperature, it is possible to define a saturation temperature $T_S$ below which the solution is supersaturated with respect to the layer material.

It may be difficult to prepare a growth solution having a predetermined composition by weighing each of the constituents of the solution sufficiently accurately, particularly when one of these constituents forms a small proportion (say less than 5% by weight) of the solution, and it would be necessary in such a case to add this constituent in the form of very fine particles, thus having a large specific surface and being prone to contamination.

It is desirable in a manufacturing process of liquid phase epitaxy growth that each charge of solution used should have an almost identical $T_s$ value. Preferably each charge should consist of essentially the same quantity of material in order that both the composition and thickness of the grown epitaxial layers should be consistent.

SUMMARY OF THE INVENTION

The invention provides a method of simultaneously preparing a plurality of castings of a solution of A which is an element or a compound in a solvent B which is an element and/or a compound, which solution is saturated with A at a temperature $T_S$, the method comprising the steps of preparing a melt consisting of B, or of B together with at least one of the constituent elements of A, or of a solution of A in B which is unsaturated with respect to A at $T_S$ in a trough of a boat body of a liquid-tight boat assembly, establishing an equilibrium at the temperature $T_S$ between an excess of a solid body and the melt so that part of the solid body dissolves in the melt so as to form the saturated solution, which body is solid at $T_S$ and consists of A or at least of any constituent of A in which the initial melt composition is deficient with respect to the saturated solution composition, pouring the saturated solution into a plurality of moulds so as to fill the moulds which open directly or indirectly into the trough, and then allowing the saturated solution in the moulds to solidify to form the castings, wherein the solid body is contained in a solid-retaining portion of the trough separated by an apertured partition from the remainder of the trough, and the equilibrium is established by repeatedly rocking the trough so that the melt cyclically flows into and out of the solid-retaining portion of the trough and progressively dissolves part of the solid body.

A method according to the invention provides a simple process for reproducibly making castings of a solid solution having a predetermined composition. It is preferred that the melt which is equilibrated with the solid body should have the composition of a solution of A in B which is nearly saturated at $T_S$, in order that the time taken to reach an equilibrium should not be unduly long.

The castings made by a method according to the invention may be used, for example, as charges for a liquid epitaxy growth process performed in a sliding boat apparatus. A method according to the invention may be used to produce pellets of a material containing a predetermined quantity of a dopant. Such pellets can subsequently be used, for example, to provide a small concentration such as 0.1% of a dopant in a solution used in a liquid phase epitaxy growth process, or for introducing a small amount of a dopant into a melt used for growing a single crystal by a Bridgman process.

The saturated solution may be a solution of a III-V compound, for example a solution of gallium indium phosphide in indium, prepared by bringing a melt consisting of indium and indium phosphide, either with or without gallium phosphide into equilibrium with a solid gallium phosphide body at $T_s$.

The saturated solution may be a solution of a II-VI compound, for example, cadmium mercury telluride in tellurium, made by bringing a melt consisting of mercury telluride and tellurium, either with or without cadmium telluride, into equilibrium with a solid cadmium telluride body at $T_s$ in a hydrogen atmosphere. Preferably this melt is contained in a carbon boat in order to improve the freedom from surface oxidation of the charges. By using a carbon boat in the presence of hydrogen, a much cleaner product is obtained, since the water produced by reducing the oxide with hydrogen is reduced by the carbon to hydrogen and carbon monoxide. Thus much more oxide from the surfaces of the melt components can be reduced with a given quantity of hydrogen in the presence of carbon than is possible when the same quantity of hydrogen is used in the absence of carbon.

It was found that a method according to the invention made it possible to prepare saturated cadmium mercury telluride solutions in an acceptable time and to grow epitaxial films having reproducible compositions, as will be evident from Example 1 described below.

The composition of a saturated solution may be ascertained from a phase diagram of the relevant system, for example, see the article "Liquidus isotherms, solidus lines and LPE growth in the Te-rich corner of the Hg-Cd-Te system" by T. C. Harman in the Journal of Electronic Materials, Vol. 9 No. 6 (1980), pages 945-961. In order to reduce the time needed to establish the equilibrium, it is preferred to use a melt containing all the constituents of the composition, and then the equilibrating process is effectively a process in which the melt composition is adjusted to the saturated solution composition, rather than a process in which a major change of composition is effected.

An apparatus used in a method according to the invention may comprise a liquid-tight boat assembly comprising a boat body having a trough provided with a solid-retaining portion separated from a melt-containing portion by partition means which allow the melt to flow between the two portions, a plurality of moulds within the boat assembly and which open directly or indirectly into the trough, and a lid, rocking means which rock the boat assembly so as to cause the melt to cyclically flow into and out of the solid-retaining portion of the trough, and rotation means which rotate the boat assembly so as to transfer the saturated solution from the trough into each of the moulds. The lid of the boat assembly may define the bottom of each mould. Preferably each mould is tapered. The boat assembly may be made, for example, of graphite or of a machinable ceramic.

The starting materials used to prepare the saturated solution can be in the form of relatively large pieces, thus having relatively small specific surfaces, so that contamination of the solution from contaminants present on the surfaces of the starting materials is reduced. The composition of the charges is automatically adjusted to the composition of the saturated solution at the equilibration temperature. It is thus not necessary to know the liquidus temperature accurately. When the charges are used in a liquid phase epitaxy growth process, growth is commenced at the equilibration temperature.

In a method according to the invention, the saturated solution is prepared in a sealed boat assembly in which the pellets are cast, and this provides advantages of eliminating contamination (due to changing vessels), of efficiency (operations saved), and of achieving improved compositional uniformity, both within a batch of castings and between different batches.

BRIEF DESCRIPTION OF THE DRAWINGS

Some embodiments of the invention will now be described with reference to the following examples and to the accompanying drawings, in which.

DESCRIPTION OF THE PREFERRED EMBODIMENTS

Figure 1:
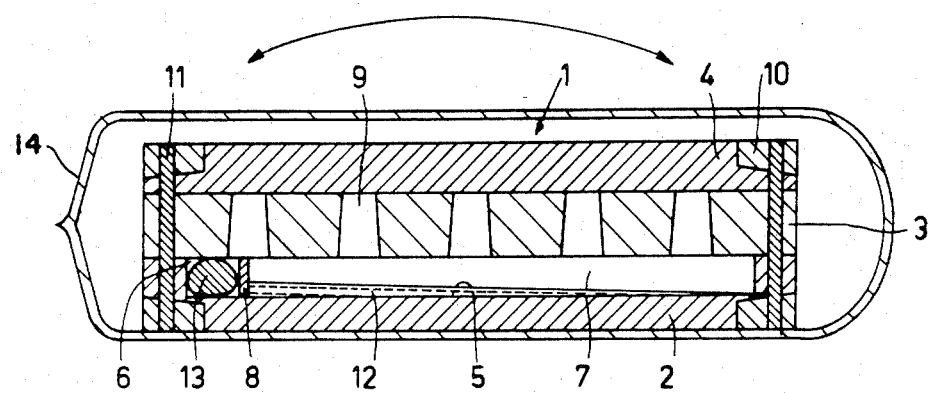
FIG. 1 is a schematic side-sectional elevation of a sealed "PYREX" (Trade Mark) ampoule containing a boat assembly used to perform a method according to the invention.
Figure 2:
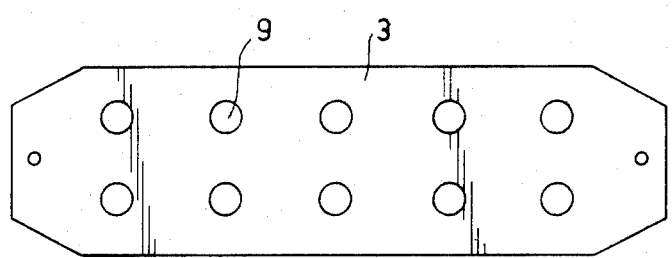
FIG. 2 is a plan view of a mould-defining member 3 of the boat assembly shown in FIG. 1.
Figure 3:
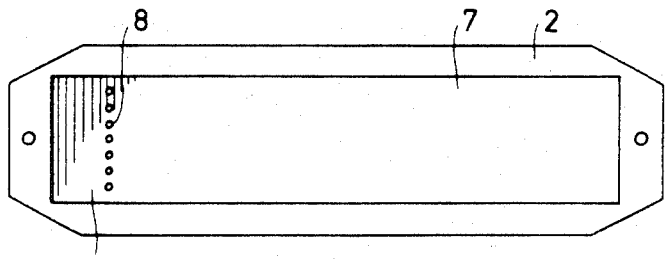
FIG. 3 is a plan view of a boat body 2 of the boat assembly shown in FIG. 1.

Referring to FIGS. 1 to 3, a liquid-tight boat assembly 1 made of graphite consists of three main components, namely a boat body 2, a mould-defining member 3 and a lid 4. The boat body 2 contains a trough 5 having a solid-retaining portion 6 separated from a melt-containing portion by partition means in the form of vertically extending graphite pins 8 which allow molten material free access to a solid body located in the solid-retaining portion 6 of the trough 5. The mould-defining member 3 is sandwiched between the boat body 2 and the lid 4, and is provided with five pairs of tapered through bores 9, each bore 9 being closed by the lid 4 which serves as the bottom of each of the moulds formed by the bores 9. The main components 2, 3 and 4 of the boat assembly are located by means of clamping members 10 which fit over tapered end portions of the main components 2, 3 and 4. Graphite pins 11 pass through holes in the clamping members 10 and the main components 2, 3 and 4.

EXAMPLE 1

Data derived from Journal of Electronic Materials, Vol. 9 No. 6 (1980) 945-61, and Journal of Crystal Growth, Vol. 13-14 (1972) 668, indicate that when growing $Cd_xHg_{1-x}Te$ at 500° C. from a solution having the composition $(Cd_zHg_{1-z})_{1-y}Te_y$, when $x=0.2$, $z$ should be approximately 0.054 and $y$ should be approximately 0.806. These values of $z$ and $y$ correspond to 0.3931 g CdTe, 9.3943 g HgTe and 12.1820 g Te in order to provide a quantity of solution which is sufficient to fill the ten mould cavities and to provide an excess of 3% by volume.

In order to reduce the time required to reach equilibrium, a melt 12 is prepared using the above-specified quantities of HgTe and Te together with 0.275 g of CdTe. A polycrystalline source crystal 13 of CdTe weighing 0.5 g is placed in the solid-retaining portion 6, and the boat assembly is fitted together and placed in a "PYREX" ampoule 14. The ampoule 14 is evacuated, filled with $3 \times 10^4$ Pa of hydrogen and is sealed. The sealed ampoule is placed in a rocking furnace (not shown) having a temperature uniformity of ±0.1° C. over a length of 200 mm and a temperature stability of ±0.1° C. over a period of 24 hours. With the charge tipped away from the CdTe source crystal 13, the furnace temperature is increased to 500.0° C. as indicated by a chromel-alumel thermocouple which has been calibrated to ±0.1° C. against a similar thermocouple used for the LPE growth system. After 1 hour at this temperature, the ampoule 14 is rocked (so as to wash the CdTe crystal 13 with melt 12) through an angle ±15° about an axis transverse to its longitudinal axis with a period of 3 minutes for each rocking cycle. Rocking is continued for a further 5 hours. The ampoule is brought to the horizontal position and is then rotated 180° about its longitudinal axis, and is then rocked 5 times to help distribute the molten charge in the ten mould cavities 9. The ampoule is then left with a 5° tilt so that the excess liquid is in contact with the CdTe source, and the ampoule is cooled to room temperature. This procedure is repeated for rocking times of 10 hours and 15 hours.

The composition of the charge after 5 hours was, in weight %, Cd 0.7, Hg 26.2, Te 73.1. After 10 hours the composition was Cd 0.81, Hg 26.2, Te 73.0 and after 15 hours the composition was Cd 0.83, Hg 26.3, Te 72.9. The error on the Cd composition is ±0.02. The composition expected from published data is Cd 0.84, Hg 26.14, Te 73.03. Converting these compositions of liquidus temperature indicates that for 10-15 hours equilibration, the liquidus temperature of the prepared charges were within 2° C. of the literature values. Such an error is probably due to tolerances in the thermocouple which are difficult to allow for but by calibrating the LPE growth couple with the charge preparation couple, absolute temperatures are not important. The weights of the charges in a series of runs were constant to ±1 mg (that is to ±0.5%). This is necessary in order to achieve the desired reproducibility of layer thicknesses.

The source crystal of CdTe and excess charge is sectioned and polished. The first solid to form on the CdTe source should be the same composition as the LPE layers grown from the charge. Analysis of the thin CMT layer on the source gave x=0.23 measured by energy dispersive analysis of X-rays to an accuracy of 5%. LPE layers are grown from these charges by a sliding boat method similar to that used for the growth of III-V compound layers by LPE, see, for example "1976 Crystal Grown and Materials", edited by E. Kaldis and H. J. Scheele (North-Holland Publishing Company, 1977), pages 578 to 580, with the refinement of maintaining a partial pressure of $1.1 \times 10^4$ Pa of mercury inside the furnace. The compositions of the $Cd_xHg_{1-x}Te$ layers grown using these charges were determined by X-ray fluoroscopy and were found to have x-values in the range from 0.225 to 0.231, the accuracy of the measurements being $\pm 1\%$ (that is $\pm 0.002$ in terms of the value of x). When the compositions of films produced with different batches of charges were compared, it was found that mean x values for sets of films varied by less than $\pm 0.006$ from this mean value. It can be seen that this method of charge preparation provides both liquidus and solidus data, as well as making it possible to prepare reproducibly charges having accurately controlled compositions.

EXAMPLE 2

$Ga_{0.3}In_{0.7}As_{0.4}P_{0.6}$ is one of a set of compounds which are lattice matched for growth by liquid phase epitaxy on InP substrates. It is shown, for example, by A. T. Gorelenok et al in J. Crystal Growth 60 (1982), p.355, that the growth of this material from an indium solution at 650° C. requires a solution having the following composition (expressed in % by weight):

Ga 0.51, As 2.32, P 0.08 and In 97.08. If charges of two gram mass are to be prepared, each charge will contain about 2 mg of phosphorus, and when indium phosphide is used as the phosphorus source, about 7.5 g of InP will be needed for each charge. Even when making a charge of about 20 g from which ten pellets could be cast, it would be necessary to weigh 75.3 mg of InP.

When using a method according to the invention, a melt was made using 19.34 g of indium, 103 mg of gallium and 465 mg of As. This melt was equilibrated at 650° C. with a 0.5 g piece of InP using a method similar to that described in Example 1, pellets being cast after 15 hours rocking. The pellets obtained weighed $1.9 \pm 0.1$ g and had the following composition (expressed in atom %): Ga 0.83, In 95.37, As 3.50 and P 0.30. If the above-mentioned gallium aluminium arsenide phosphide formula is written as $Ga_yIn_{1-y}As_xP_{1-x}$, the values of x and y achieved differ from the target values by within $\pm 0.005$.

EXAMPLE 3

Figure 4:
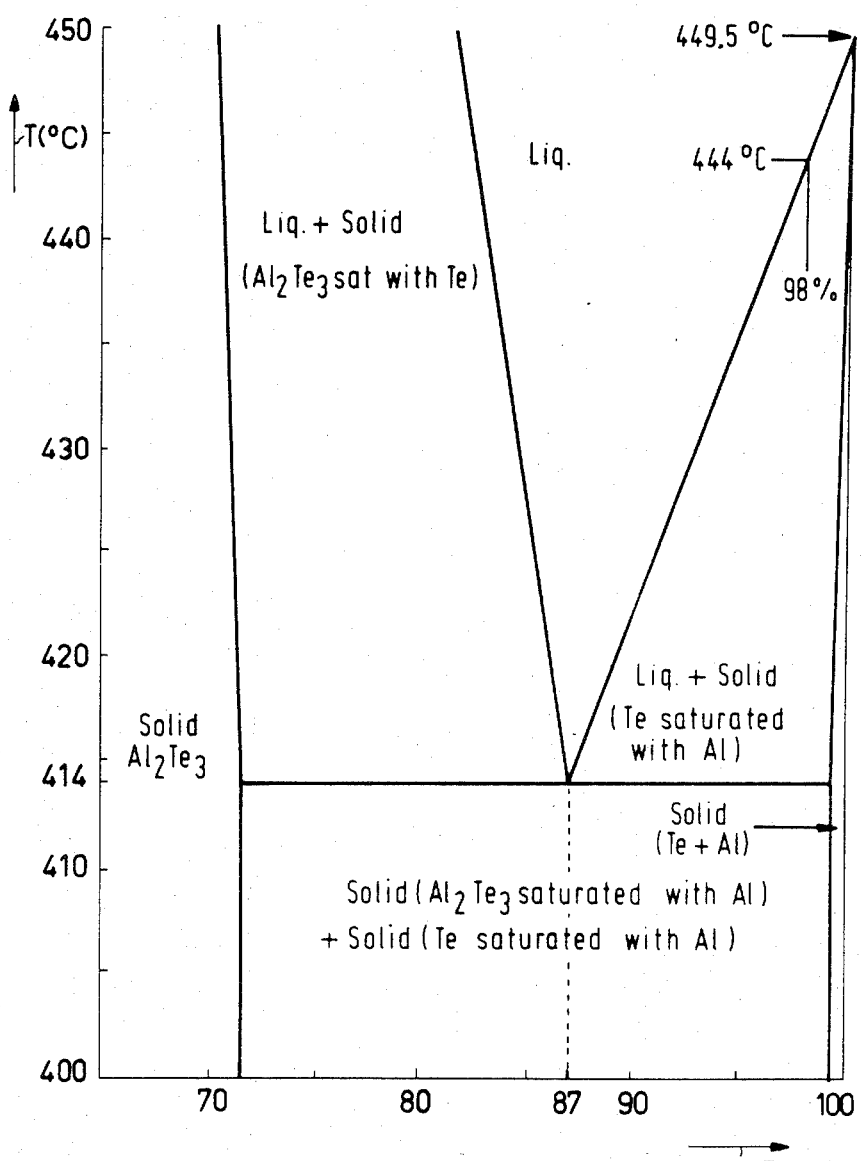
FIG. 4 is a phase diagram of part of the Al-Te system.

A method similar to that described in Example 1 was used to produce pellets of a tellurium-aluminium composition containing 2 atom % of aluminium. These pellets were subsequently used to introduce 0.1 atom % of aluminium into charges used for the growth of n-type cadmium telluride layers by a liquid phase epitaxy process. In this method an unsaturated solution of tellurium in aluminium telluride was equilibrated at 444° C. with a pure, solid tellurium body in order to saturate the solution with tellurium. It will be seen from FIG. 4 that the saturated solution contains 98 atom % of tellurium. The saturated solution was then cast to form solid pellets which contained 2 atom % of aluminium.

A melt was prepared consisting of 88 mg of aluminium and 20.2 g of pure tellurium (at 444° C. a saturated solution of tellurium in aluminium telluride containing 88 mg of aluminium contains 20.37 g of tellurium). This melt was then equilibrated at 444° C. with a solid body consisting of 0.5 g of pure tellurium. The equilibrated liquid was used to cast ten pellets each weighing 1.8 g and which contained $0.43 \pm 0.01\%$ by weight of aluminium, which is within 2.5% of the desired aluminium atom fraction of 0.02.

EXAMPLE 4

The aluminium-tellurium pellets produced by the method described in Example 3 were used to produce charges of an aluminium-doped cadmium telluride solution is tellurium, which solution was saturated at 500° C. with cadmium telluride. These charges were used subsequently for the growth of n-type cadmium telluride layers by liquid phase epitaxy The phase diagram of the Cd-Te systems shows that this cadmium telluride solution contains 2.5 atoms % Cd, or 4.72% by weight of cadmium. A melt was prepared consisting of one of the aluminium-tellurium pellets produced by the method described in Example 3, 34.2 g of pure tellurium and 1.5 g of cadmium telluride. This melt was equilibrated at 500° C. with a 1 g single crystal of cadmium telluride, and eighteen pellets were cast from the equilibrated liquid, using a method similar to that described in Example 1. The aluminium atom fraction of the equilibrated liquid was 0.001.

These cadmium telluride-containing pellets was subsequently used to grow n-type cadmium telluride layers by liquid phase epitaxy, and the grown layers had carrier concentrations of about $2 \times 10^{15}/cm^3$ at 77K.

EXAMPLE 5

A solution was prepared for the growth of $GaAs_{0.30}P_{0.70}$ by liquid phase epitaxy at 1000° C. In order to grow this material, a melt was required consisting of 5.413% by weight As, 0.89% by weight P, and 96.697% by weight Ga. It is convenient to prepare the melt using GaAs and GaP as the respective sources for the As and P, producing a solution consisting of 10.450% by weight GaAs, 2.906% by weight GaP and 86.644% by weight Ga. A melt was prepared consisting of 1.88 g of GaAs, 15.60 g of Ga and 0.51 g of GaP. This melt was equilibrated at 1000° C. with a solid GaP body and 10 pellets were cast from the equilibrated melt, using a method similar to that described in Example 1.

We claim:

1. A method of simultaneously preparing a plurality of castings of a solution of A in a solvent B, which solution is saturated with A at a temperature $T_s$, the method comprising the steps of preparing a melt consisting of B, or of B together with at least one constituent element of A, or of a solution of A in B which is unsaturated with respect to A at $T_s$ in a trough of a boat body of a liquid-tight boat assembly, establishing an equilibrium at the temperature $T_s$ between an excess of a solid body within the boat body and the melt so that part of the solid body dissolves in the melt so as to form a saturated solution, which body is solid at $T_s$ and consists of A or at least of any constituent of A in which the initial melt composition is deficient with respect to the saturated solution composition, pouring the saturated solution into a plurality of moulds so as to fill the moulds which open directly or indirectly into the trough, and then allowing the saturated solution in the moulds to solidify to form the castings, wherein the solid body is contained in a solid-retaining portion of the trough separated by an apertured partition from the remainder of the trough, and the equilibrium is established by repeatedly rocking the trough so the melt cyclically flows into and out of the solid-retaining portion of the trough and progressively dissolves part of the solid body.

2. A method as claimed in claim 1, wherein the castings form pellets which consist of charges to be sized in a liquid phase epitaxy growth process.

3. A method as claimed in claim 2, wherein the pellets consist of a solid solution of a II–VI compound.

4. A method as claimed in claim 2, wherein the pellets consist of a solid solution of a III–V compound.

5. A method as claimed in claim 1, wherein A is an element.

6. A method as claimed in claim 1, wherein A is a compound.

7. A method as claimed in claim 1, wherein B is an element.

8. A method as claimed in claim 1, wherein B is a compound.

* * * * *